(12) United States Patent
Chou et al.

(10) Patent No.: US 7,365,009 B2
(45) Date of Patent: Apr. 29, 2008

(54) STRUCTURE OF METAL INTERCONNECT AND FABRICATION METHOD THEREOF

(75) Inventors: Pei-Yu Chou, Taipei Hsien (TW); Chun-Jen Huang, Tainan Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 13 days.

(21) Appl. No.: 11/306,590

(22) Filed: Jan. 4, 2006

(65) Prior Publication Data

US 2007/0155157 A1 Jul. 5, 2007

(51) Int. Cl.
*H01L 21/44* (2006.01)

(52) U.S. Cl. .............. 438/675; 438/692; 438/733; 438/740; 257/E21.17; 257/E21.304; 257/E21.435; 257/E21.229; 257/E21.058; 257/E21.577; 257/E21.585

(58) Field of Classification Search .......... 438/675, 438/270, 700, 672, 692, 680, 597, 734, 735, 438/683, 687, 931, 740, 744, 706, 745, 733, 438/786, 724, 757

See application file for complete search history.

(56) References Cited

U.S. PATENT DOCUMENTS

| | | | | |
|---|---|---|---|---|
| 5,904,565 A | * | 5/1999 | Nguyen et al. | 438/687 |
| 6,004,883 A | * | 12/1999 | Yu et al. | 438/706 |
| 6,057,227 A | * | 5/2000 | Harvey | 438/626 |
| 6,191,028 B1 | * | 2/2001 | Huang et al. | 438/633 |
| 6,211,061 B1 | * | 4/2001 | Chen et al. | 438/622 |
| 6,287,961 B1 | * | 9/2001 | Liu et al. | 438/638 |
| 6,479,380 B2 | * | 11/2002 | Furusawa et al. | 438/638 |
| 6,902,972 B2 | | 6/2005 | Tsau | |
| 2003/0207561 A1 | | 11/2003 | Dubin | |

FOREIGN PATENT DOCUMENTS

| | | |
|---|---|---|
| WO | 0229892 | 4/2002 |
| WO | 03054928 | 7/2003 |
| WO | 2004003980 | 1/2004 |

* cited by examiner

*Primary Examiner*—David Nhu
(74) *Attorney, Agent, or Firm*—Winston Hsu

(57) ABSTRACT

A process and structure for a metal interconnect includes providing a substrate with a first electric conductor, forming a first dielectric layer and a first patterned hard mask, using the first patterned hard mask to form a first opening and a second electric conductor, forming a second dielectric layer and a second patterned hard mask, using the second patterned hard mask as an etching mask and using a first patterned hard mask as an etch stop layer to form a second opening and a third electric conductor.

14 Claims, 20 Drawing Sheets

STRUCTURE OF METAL INTERCONNECT AND FABRICATION METHOD THEREOF

BACKGROUND OF THE INVENTION

1. Field of the Invention

The present invention relates to a fabrication method and structure of metal interconnect, and more particularly, to a method and structure of metal interconnect using a hard mask as an etching mask and etch stop layer.

2. Description of the Prior Art

The miniaturization of semiconductor devices has achieved nanometer scale as the line width of ICs becomes smaller and smaller. When the integration of a single chip, i.e. density of semiconductor devices on a single chip, becomes bigger, it means the interval between devices becomes smaller. This presents difficulties when attempting to form contact holes and metal interconnect.

Please refer to FIGS. 1-11. FIGS. 1-11 are schematic, cross-sectional diagrams showing the process of forming contact holes and metal interconnect in accordance with a prior art method. As shown in FIG. 1, a metal-oxide-semiconductor (MOS) transistor device 20 is formed on a semiconductor substrate 10. The MOS transistor device 20, which is isolated by shallow trench isolations (STIs) 24, includes source/drain regions 12, a gate electrode 14, and a spacer structure 16 disposed on the sidewalls of the gate electrode 14. The semiconductor substrate 10 further includes a contact etch stop layer (CESL) 32 deposited over the MOS transistor device 20 and the semiconductor substrate 10, and a first dielectric layer 34 deposited on the contact etch stop layer 32. Subsequently, a bottom anti-reflective coating (BARC) layer 36 is deposited on the first dielectric layer 34. Then, a photoresist layer 40 is formed on the BARC layer 36, and a conventional exposure-and-development process is carried out to form openings 42 in the photoresist layer 40 to define the locations of contact holes to be formed later.

As shown in FIG. 2, the photoresist layer 40 is used as an etching mask to etch the exposed BARC layer 36 and the first dielectric layer 34 through the openings 42 so as to form openings 44. The etching of the first dielectric layer 34 stops on the contact etch stop layer 32. Subsequently, as shown in FIG. 3, the remaining photoresist layer 40 and the BARC layer 36 are used as an etching hard mask to etch the exposed contact etch stop layer 32 through the openings 44, thereby forming contact holes 46. As shown in FIG. 4, the remaining photoresist layer 40 and the BARC layer 36 over the first dielectric layer 34 are removed.

As shown in FIG. 5, in order to increase adhesion between metal and the first dielectric layer 34, and prevent silicide spiking and electromigration when filling contact hole 46 with metal, a diffusion barrier layer 47, such as titanium nitride (TiN)/titanium (Ti), is required to be deposited over sidewalls of every contact hole 46 and upon gate electrode 14 and source/drain regions 12 in the bottom. Then, every contact hole 46 is filled with metal 48, such as tungsten (W), and the surface diffusion barrier layer 47 is covered with metal 48, such as tungsten (W), as shown in FIG. 6. Afterward as shown in FIG. 7, a first chemical mechanical polishing (CMP) process is proceeded to remove redundant metal 48 upon surface of the first dielectric layer 34 in order to form the required contact plug 49.

As shown in FIG. 8, an etch stop layer 50, a second dielectric layer 52, and a patterned photoresist layer 54 are deposited upon first dielectric layer 34 and contact plug 49 in sequence. The patterned photoresist layer 54 is used to as an etching mask to etch part of the second dielectric layer 52 and etch stop layer 50 to form a trench 56, as shown in FIG. 9. Subsequently, a standard copper process is carried out to deposit a diffusion barrier layer of titanium nitride (TiN)/titanium (Ti) (not shown) and a seed layer (not shown) over sidewalls of every trench 56 and upon the second dielectric layer 52 and every contact plug 49, and then electroplating is performed to form copper metal 58, as shown in FIG. 10. Finally, a second CMP process is carried out to remove redundant copper metal 58 upon the surface of second dielectric layer 52, and then metal wires 60 electrically connecting every contact plug 49 are formed separately, as shown in FIG. 11.

As mentioned above, a semiconductor contact hole process only use a photoresist pattern as an etching mask. There are more and more optical limitations of 193 nm photoresist in the lithography process, as semiconductor devices require smaller after-etch-inspection critical dimension (AEI CD) of contact holes. Therefore, in the prior art standard 65 nm contact hole process, photoresist thickness has to be lowered to 2800 angstroms in order to fabricate 65 nm contact holes in the lithography process; and in the 45 nm contact hole process, photoresist thickness has to be lowered to 2200 angstroms in the lithography process. However, excessively thin photoresist can cause boundary defects due to insufficient shielding in the etching process, so hard masks are required to be used in the etching process. Ordinary polysilicon hard masks are not able to be used in 45 nm processes because phase variation of silicide, such as NiSi, can result.

In addition, The above-described prior art method of forming metal interconnect has another drawback: an etch stop layer is required to be deposited before forming a trench.

SUMMARY OF THE INVENTION

It is therefore one of the objects of the claimed invention to provide a method and structure of metal interconnect using a hard mask as an etching mask and an etch stop layer to overcome the aforementioned problems.

According to claims disclosed in the present invention, the present invention provides a fabrication method and structure of metal interconnect. The method includes:

providing a substrate and at least a first electric conductor;

forming a first dielectric layer over the first electric conductor on the substrate;

forming a first patterned hard mask on the first dielectric layer to define at least a first opening;

using the first patterned hard mask as an etching mask to etch the first dielectric layer to form the first opening in the first dielectric layer;

forming a second electric conductor in the first opening and electrically connecting the second electric conductor to the first electric conductor;

forming a second dielectric layer over the first patterned hard mask and the second electric conductor;

forming a second patterned hard mask on the second dielectric layer to define at least a second opening;

using the second patterned hard mask as an etching mask and using the first patterned hard mask and the second electric conductor surface as an etch stop layer to etch the second dielectric layer to form the second opening in the second dielectric layer; and forming a third electric conductor in the second opening and electrically connecting the third electric conductor to the second electric conductor.

The structure includes:

a first dielectric layer positioned on the substrate and covering the first electric conductor;

a first patterned hard mask positioned on the first dielectric layer;

a second electric conductor positioned in the first patterned hard mask and the first dielectric layer and electrically connected with the first electric conductor;

a second dielectric layer positioned on the first patterned hard mask and the second electric conductor; and a third electric conductor positioned in the second dielectric layer and over the first patterned hard mask and electrically connected with the second electric conductor The present invention transfers the pattern of a patterned photoresist layer to a hard mask layer first, and then uses the patterned hard mask as an etching mask to etch a first dielectric layer to form contact holes. Therefore, AEI CD can be made be smaller than ADI CD. The patterned hard mask of the present invention can be an etching mask of contact holes, a stop layer of a CMP process for contact plugs, and an etch stop layer of a trench in a metal interconnect process. In addition, the present invention uses SiC or SiCN made in low temperature as a patterned hard mask, and therefore a phase variation of NiSi positioned upon a gate electrode and source/drain regions can be avoided effectively.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
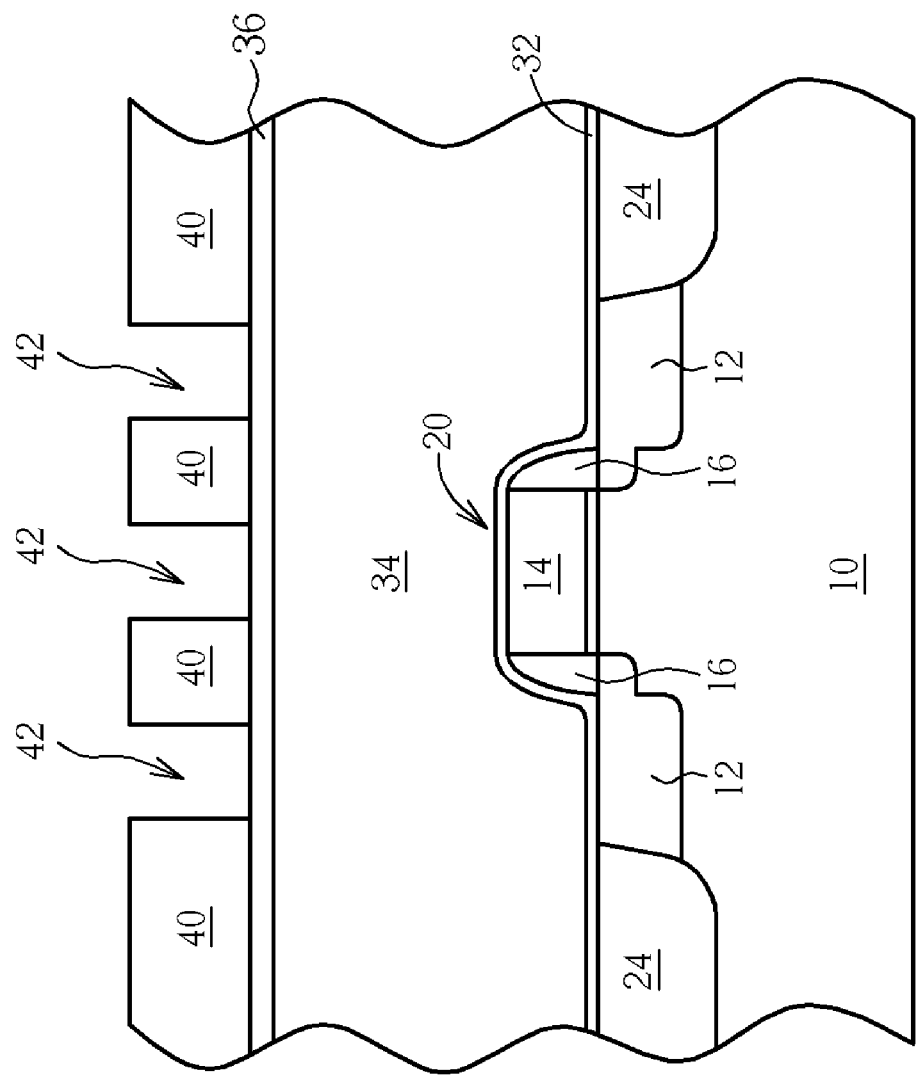
FIGS. 1-11 are schematic, cross-sectional diagrams showing a process of fabricating a metal interconnect structure in accordance with the prior art.
Figure 2:
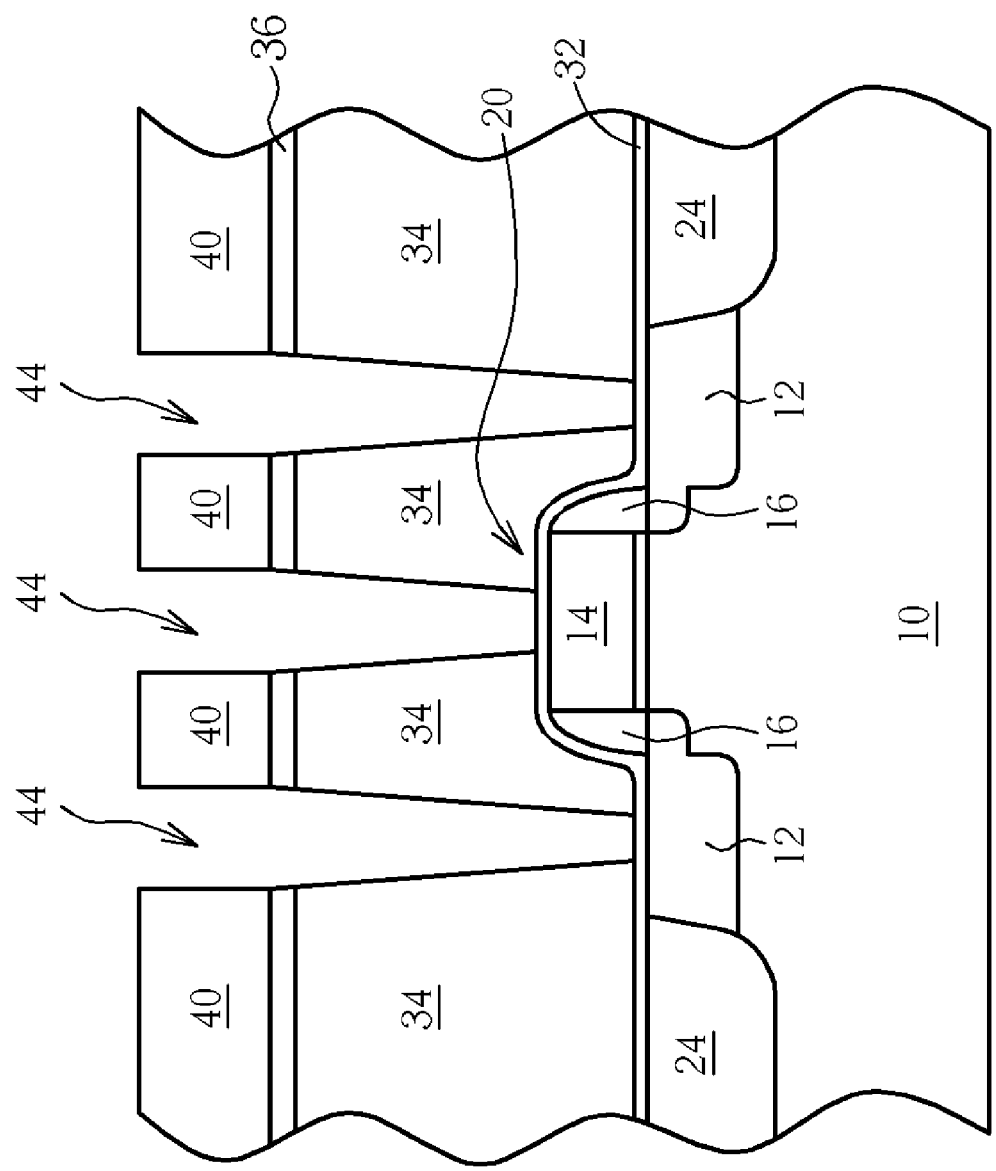
Figure 3:
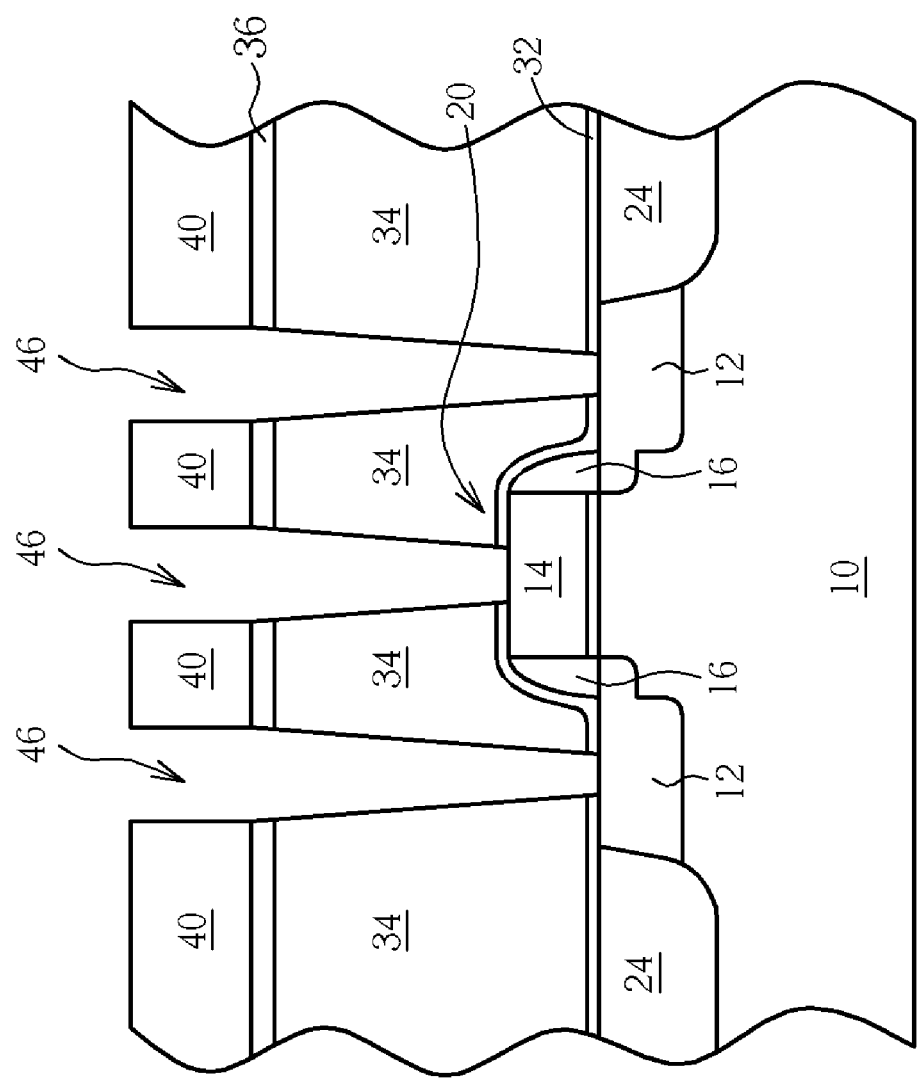
Figure 4:
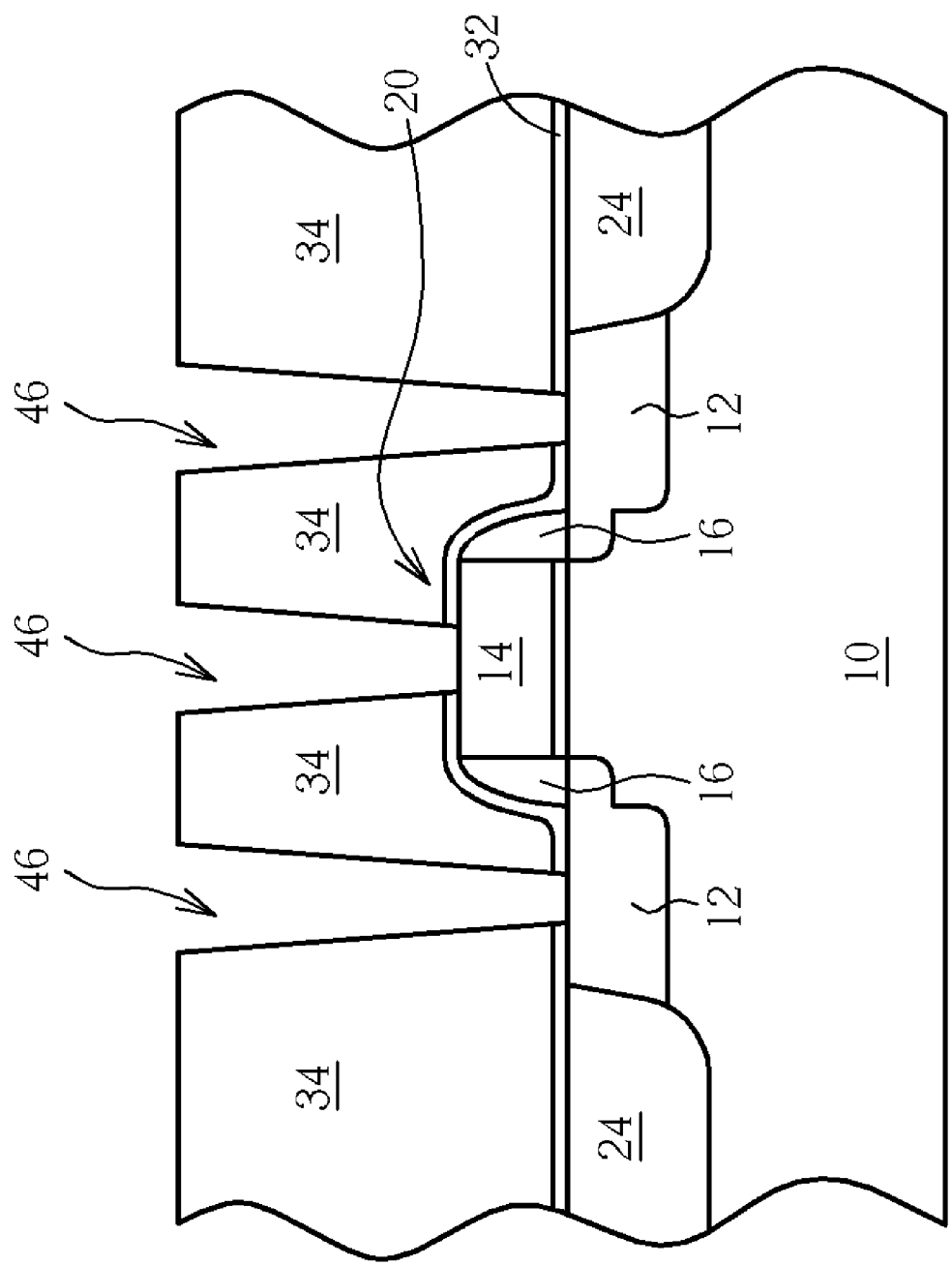
Figure 5:
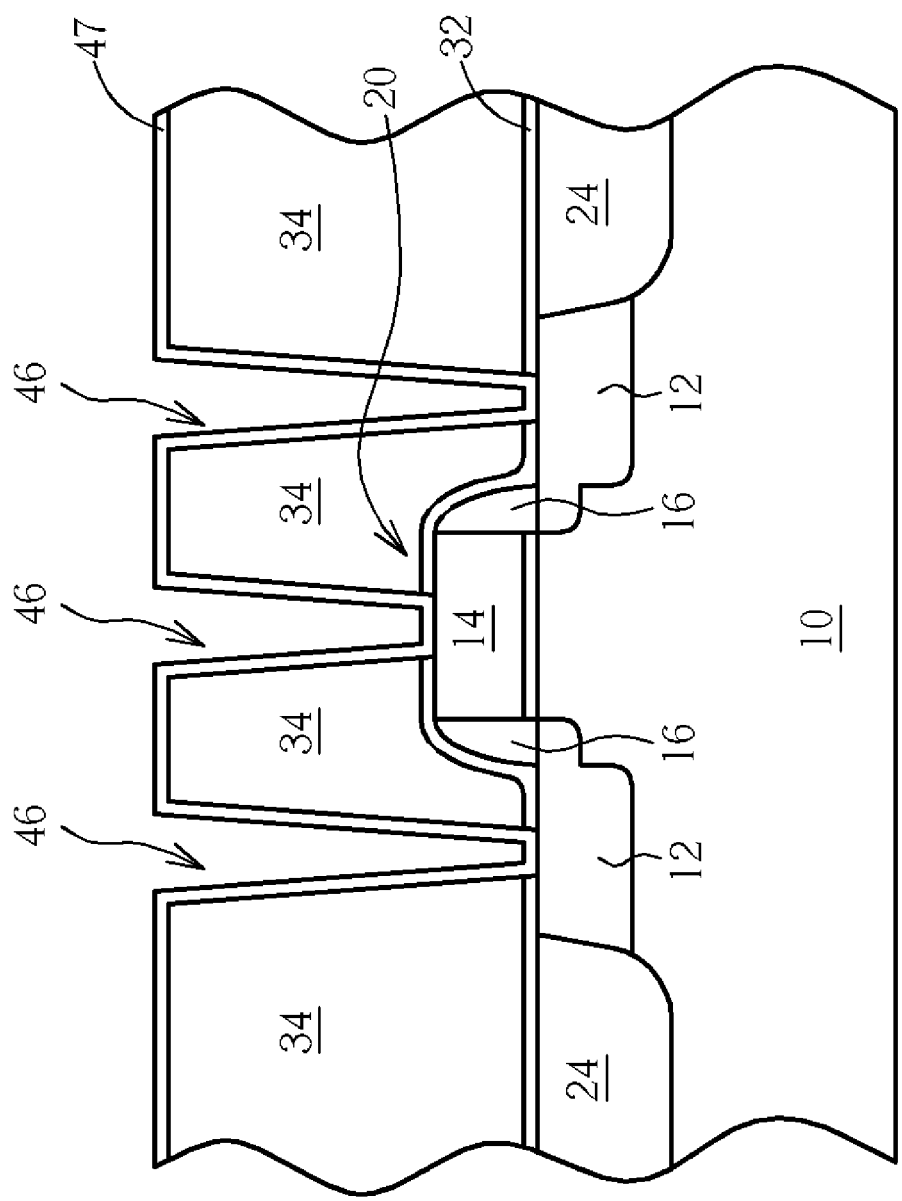
Figure 6:
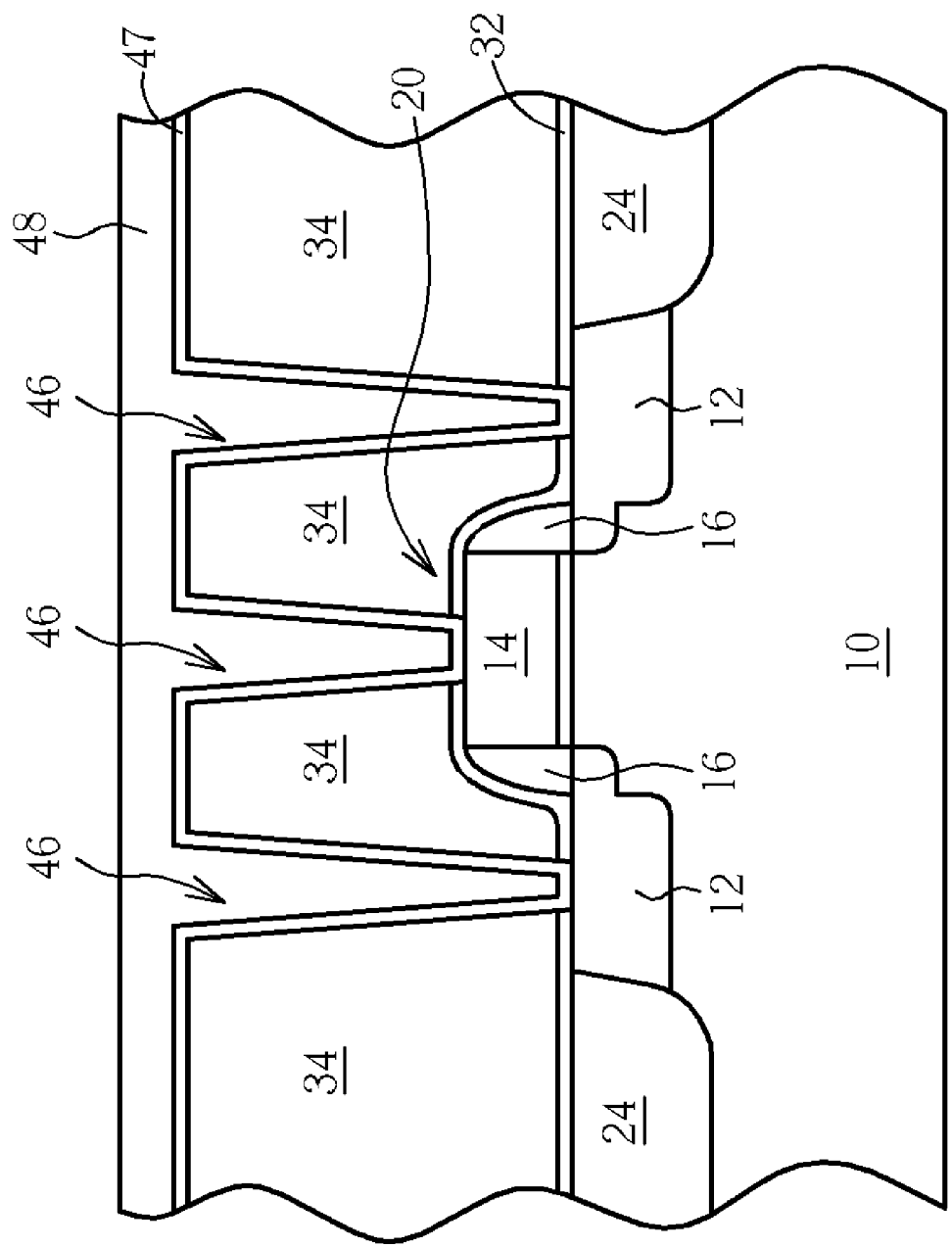
Figure 7:
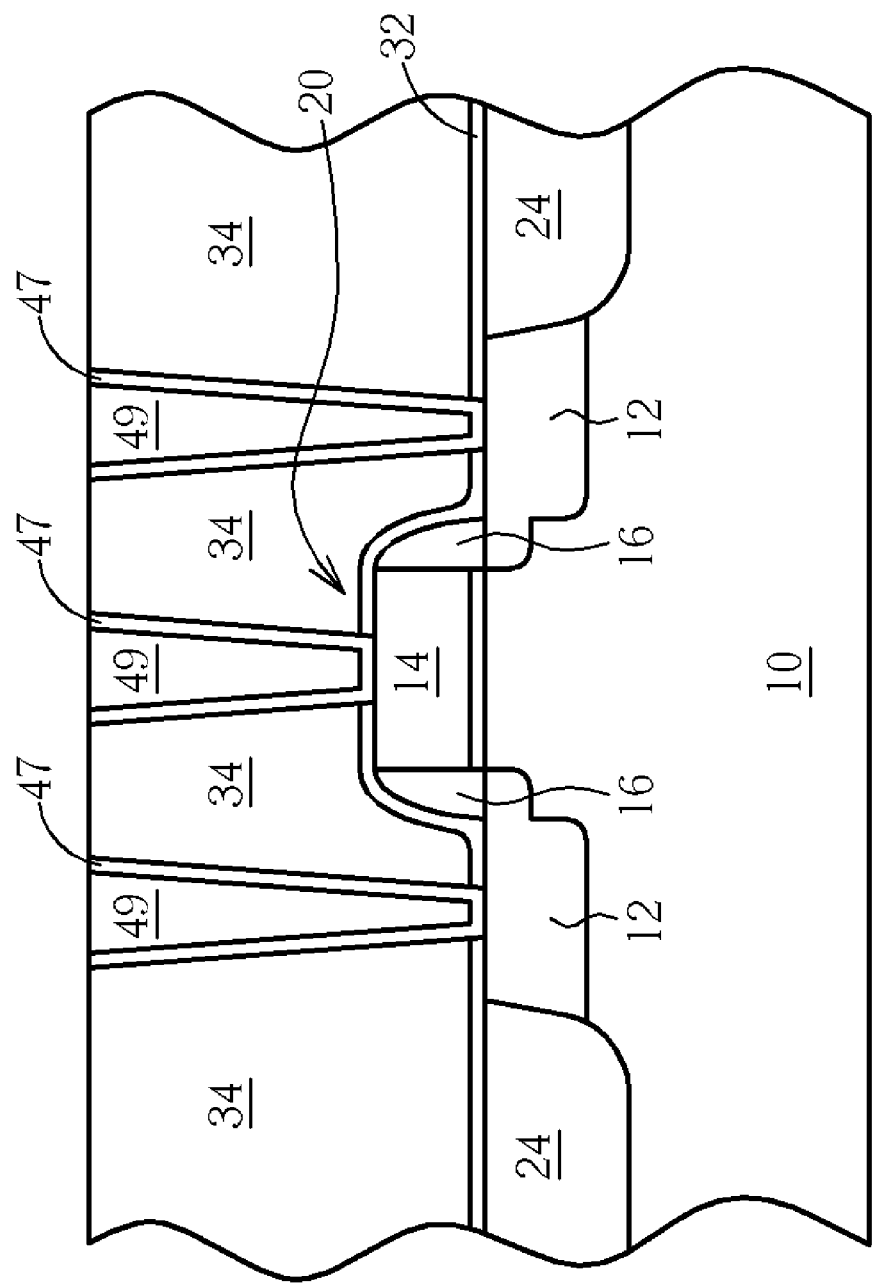
Figure 8:
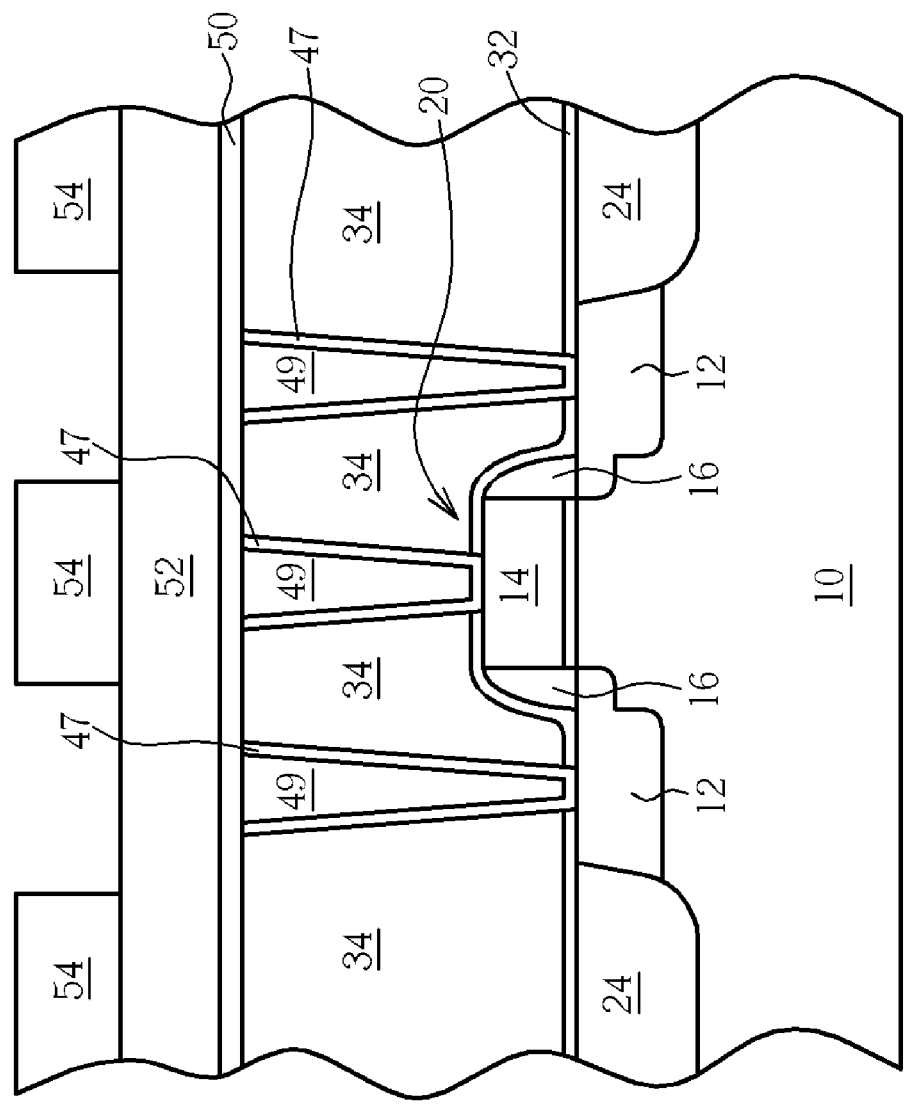
Figure 9:
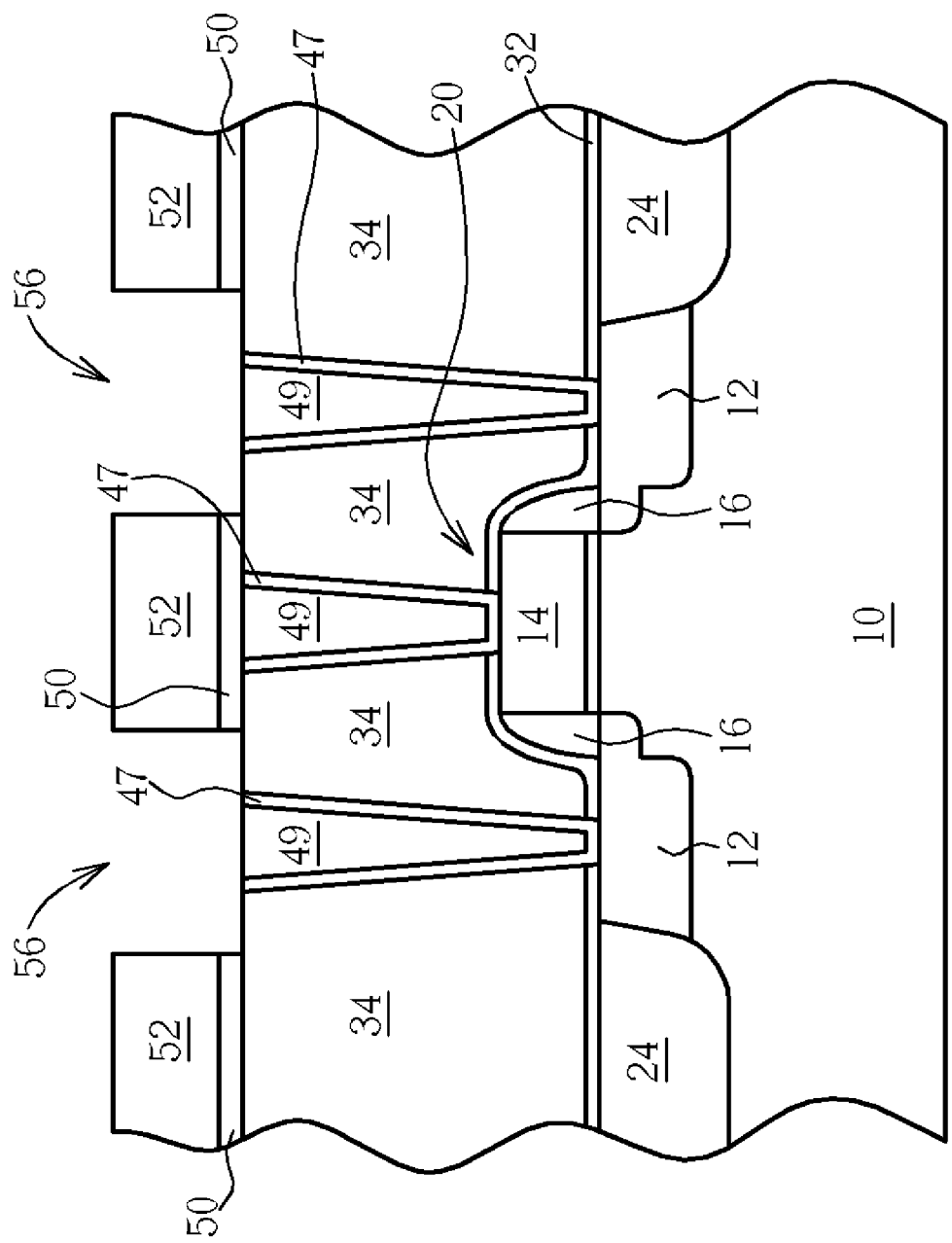
Figure 10:
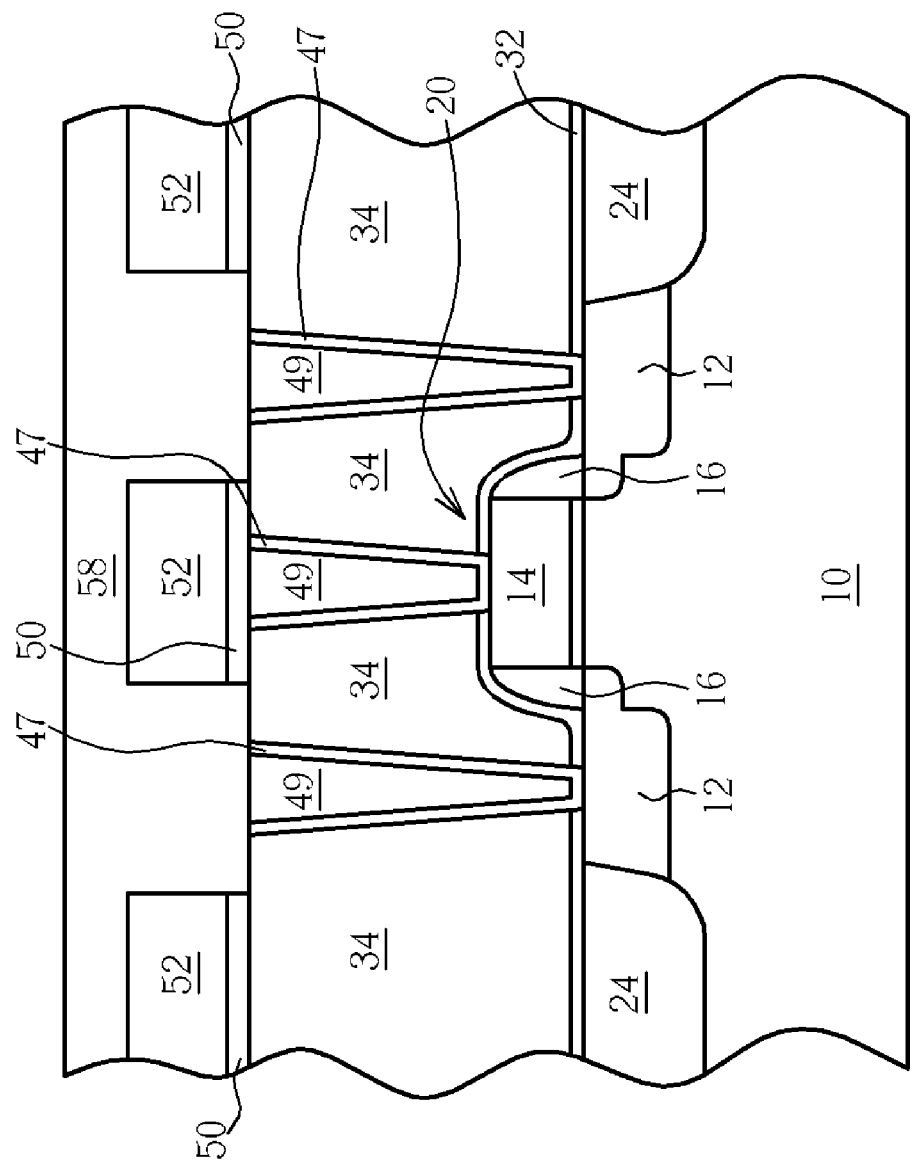
Figure 11:
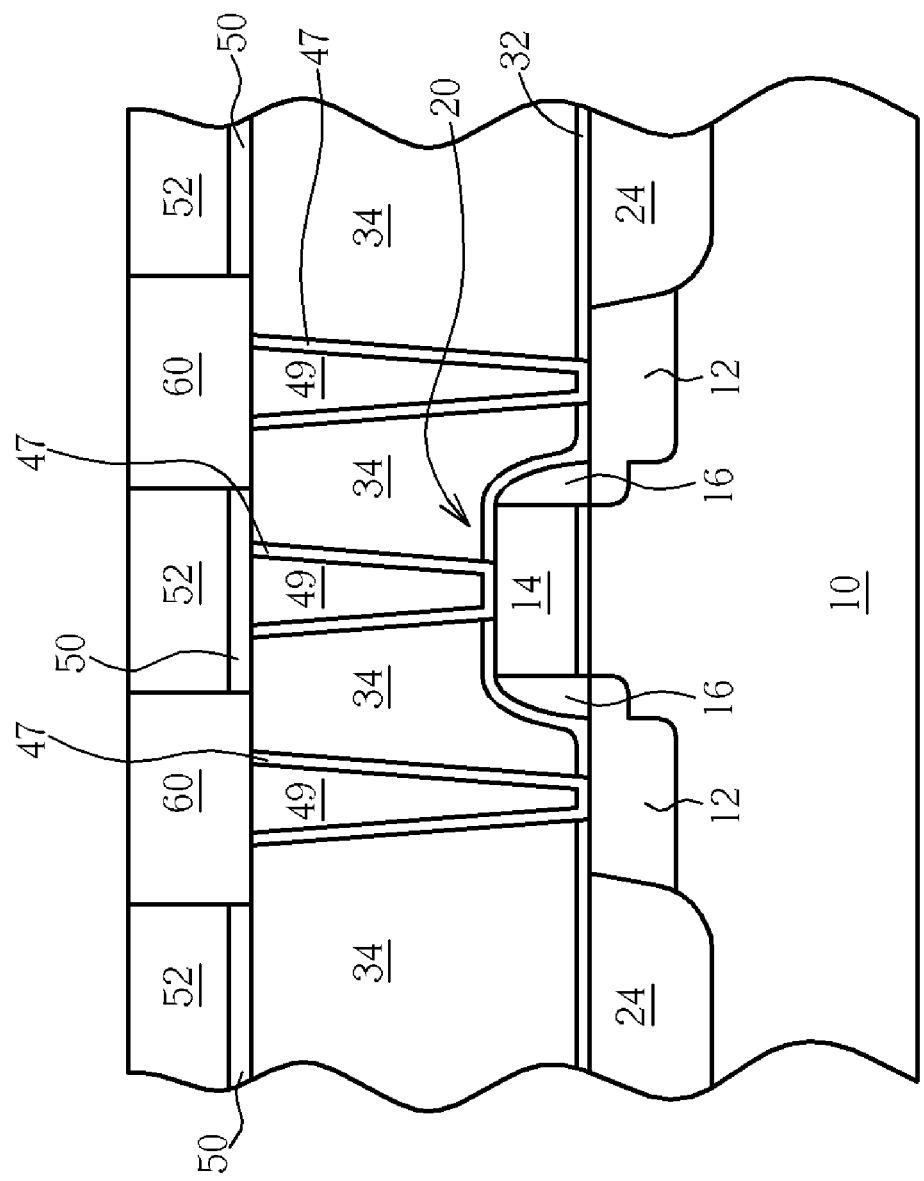
Figure 12:
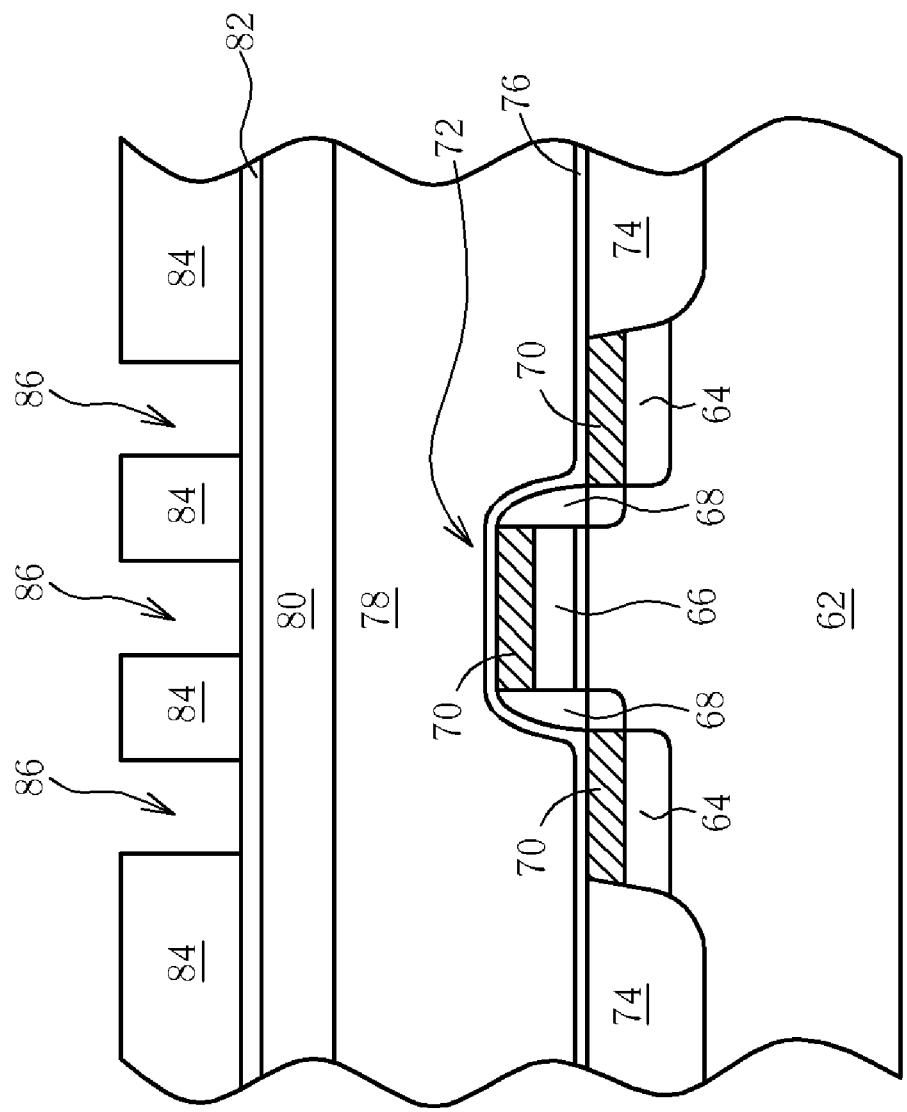
FIGS. 12-20 are schematic, cross-sectional diagrams illustrating a method of fabricating a metal interconnect structure in accordance with a preferred embodiment of the present invention.

Please refer to FIGS. 12-20. FIGS. 12-20 are schematic, cross-sectional diagrams illustrating a method of fabricating a metal interconnect structure in accordance with a preferred embodiment of the present invention. As shown in FIG. 12, first a semiconductor substrate 62 such as wafer or SOI is provided, and at least one MOS transistor device 72 is formed on the semiconductor substrate 62. The MOS transistor device 72, which is isolated by shallow trench isolations 74, includes source/drain regions 64, a gate electrode 66, and a spacer structure 68 disposed on the sidewalls of the gate electrode 66. The MOS transistor device 72 may further includes silicides 70 disposed on the surface of the gate electrode 66 and the source/drain regions 64. The material of the silicides 70 can be NiSi formed by a salicide process. The semiconductor substrate 62 further includes a contact etch stop layer 76 deposited over the MOS transistor device 72 and the semiconductor substrate 62, and a first dielectric layer 78 deposited on the contact etch stop layer 76.

In selecting the materials of the first dielectric layer 78 and the contact etch stop layer 76, etching selectivity should be a concern. Normally, the first dielectric layer 78 may include tetraethylorthosilicate (TEOS) oxide, un-doped silicon glass, or doped silicon oxide such as borophosphosilicate glass (BPSG), FSG, PSG or BSG. Spin coating or chemical vapor deposition (CVD), such as a plasma-enhanced chemical vapor deposition (PECVD) method, or other deposition techniques may be used to deposit the first dielectric layer 78. The contact etch stop layer 76 may include material with high stress, such as SiN, or other materials having high etching selectivity with the first dielectric layer 78.

Subsequently, a hard mask layer 80, a first BARC layer 82, and a patterned photoresist layer 84 are formed upon the first dielectric layer 78 in sequence. The patterned photoresist layer 84 has a plurality of openings 86. The openings 86 are disposed corresponding to the gate electrode 66 and the source/drain regions 64 so as to define the locations of contact holes. In the preferred embodiment of the present invention, material of the hard mask layer 80 is composed of a chemical compound of silicon with carbon or nitrogen, such as SiC or SiCN, that can be made at low temperature because when choosing material of the hard mask layer 80, the forming temperature of the hard mask layer 80 is required to be under 400° C. in order to avoid phase variation of NiSi upon the gate electrode 66 and the source/drain regions 64. The first BARC layer 82 can be SiON.

Figure 13:
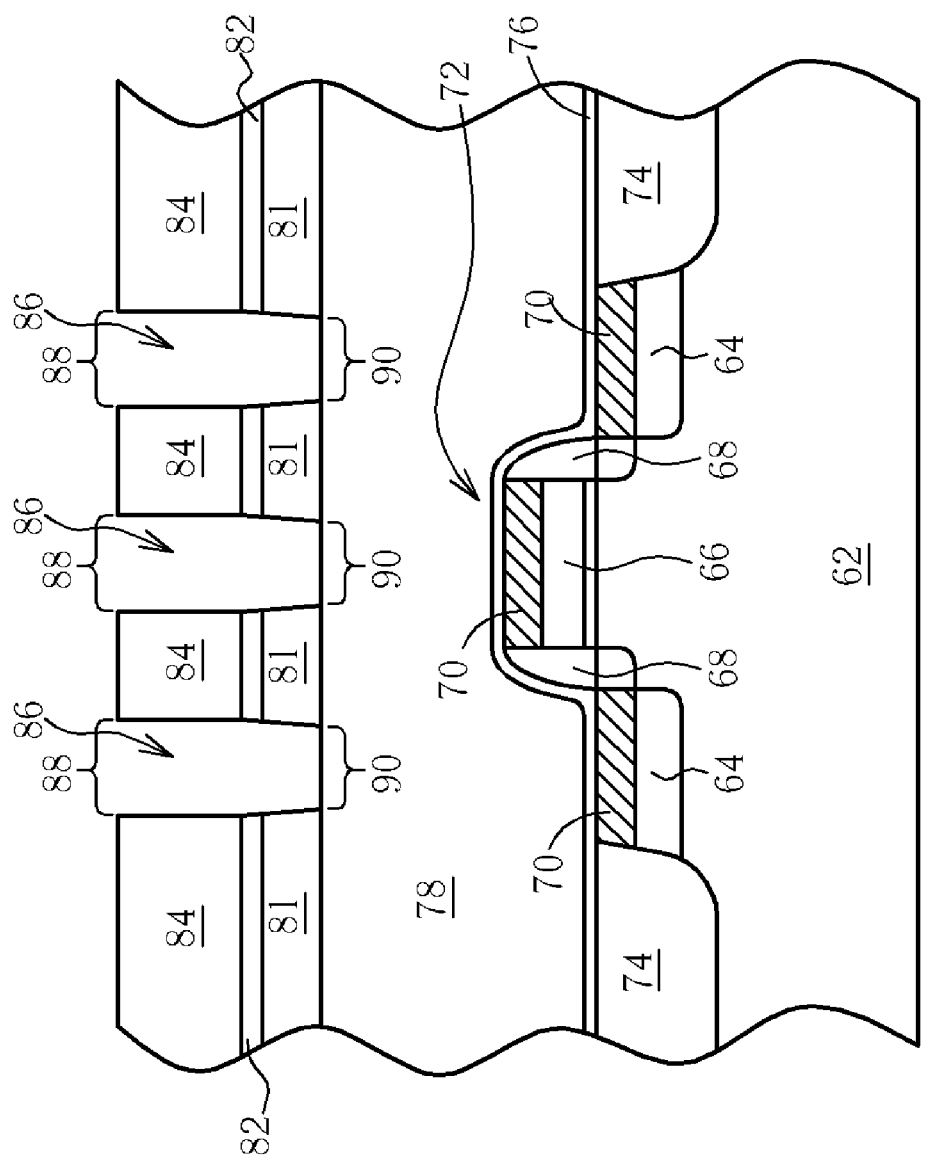

Afterwards, an anisotropic etching process is performed by using the patterned photoresist layer 84 as an etching mask to etch the first BARC layer 82 and the hard mask layer 80 through the openings 86 to transfer the pattern of the patterned photoresist layer 84 to the hard mask layer 80 in order to form a first patterned hard mask 81, as shown in FIG. 13. By control and adjustment of etching parameters, the ADI CD 88 of the patterned photoresist layer 84 is larger than the AEI CD 90 of the first patterned hard mask 81 in the present invention, and a semiconductor process under 45 nm can be accomplished.

Figure 14:
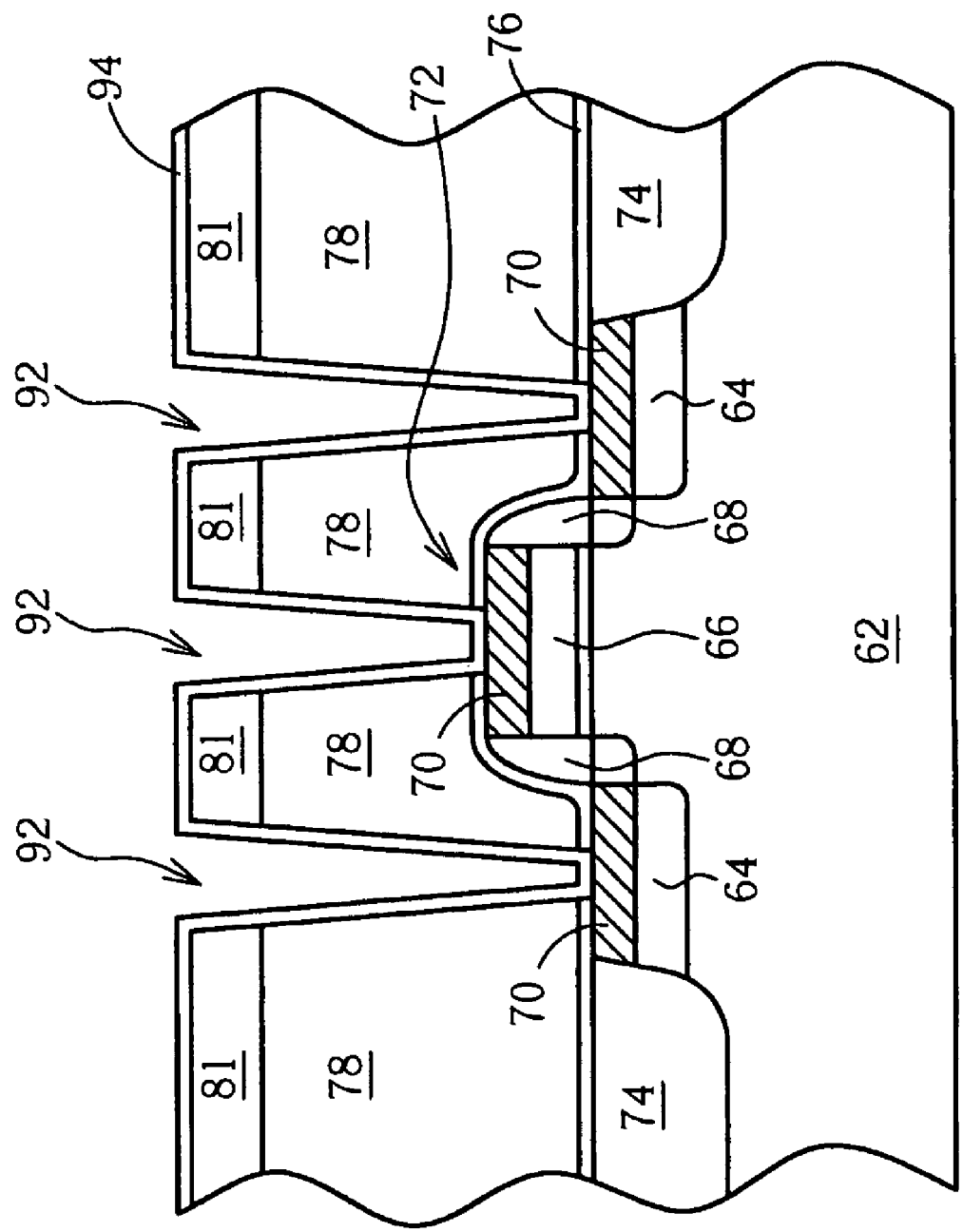

As shown in FIG. 14, after removing the patterned photoresist layer 84 and the first BARC layer 82, the present invention uses the first patterned hard mask 81 as an etching mask to etch the first dielectric layer 78 and the contact etch stop layer 76 to form a plurality of openings as contact holes 92 in the first dielectric layer 78 and the contact etch stop layer 76. A cleaning process is performed to remove polymer residues or particles remaining in the sidewalls of the contact holes 92. The cleaning process can be a wet clean process or a dry clean process, and can be performed in-situ or ex-situ. Then, a diffusion barrier 94 is formed on the first patterned hard mask 81 and the sidewalls of the contact holes 92. The diffusion barrier 94 is a composite metal layer such as titanium nitride (TiN)/titanium (Ti) or tantalum nitride (TaN)/tantalum (Ta) in order to avoid metal atom diffusion damaging the device character, and to increase adhesion between metal and the first dielectric layer 78. To ensure good conductivity of the gate electrode 66 and the source/drain regions 64 or maintain clean sidewalls of the contact holes 92, at least a surface process is carried out after forming contact holes 92. The surface process can be a doping process to lower resistance of the gate electrode 66 and the source/drain regions 64 to benefit follow-up fabrication of contact plugs.

Figure 15:
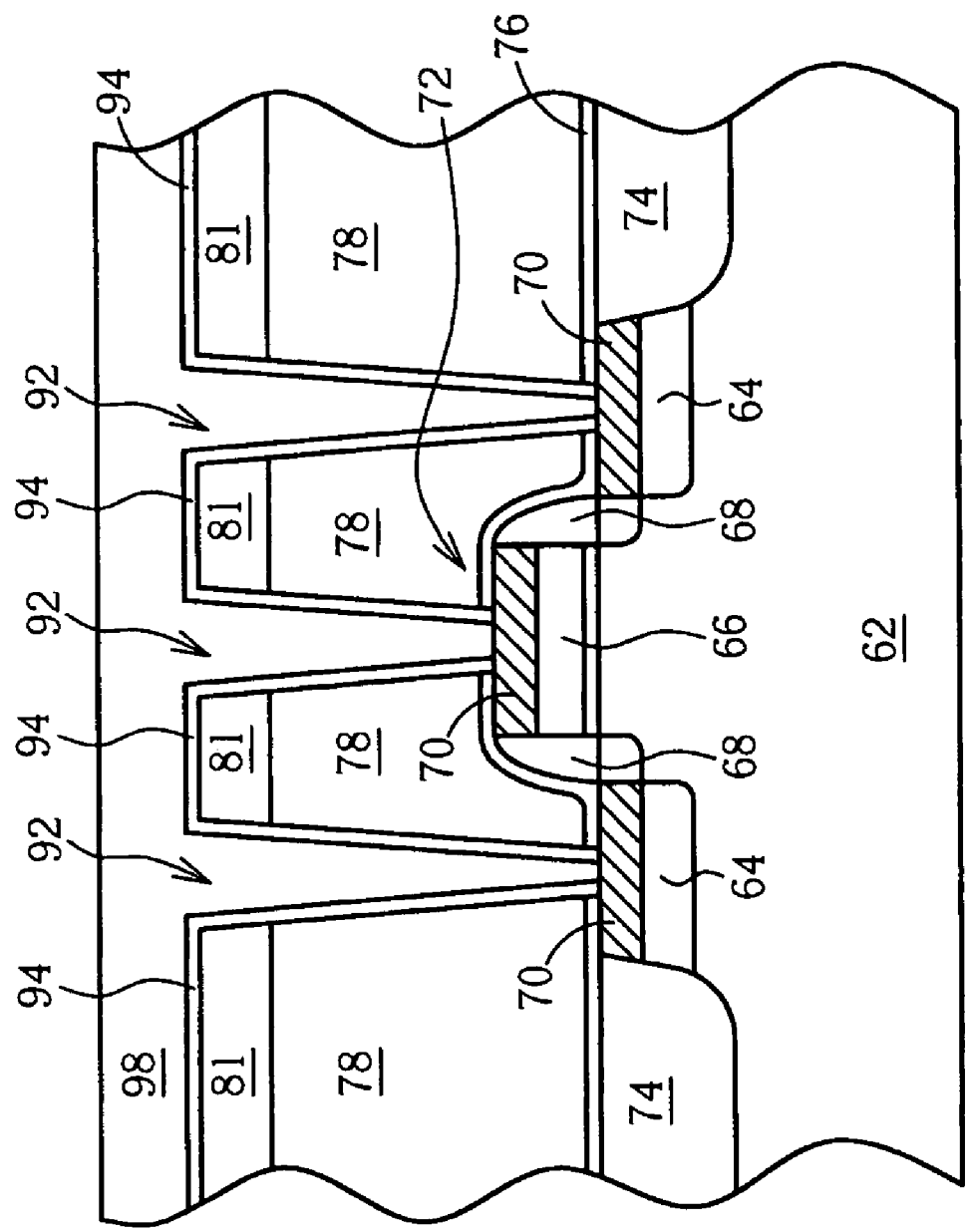
Figure 16:
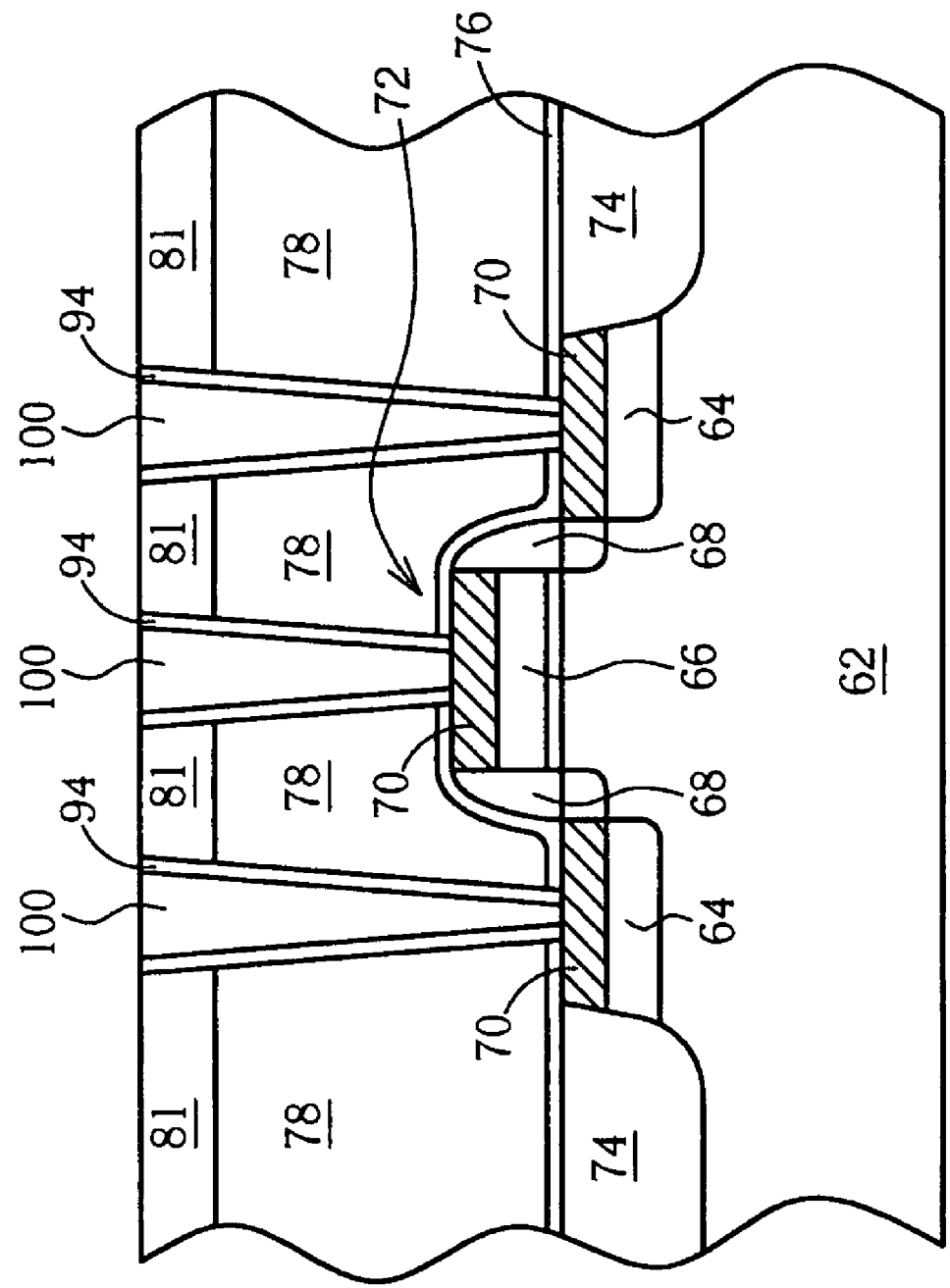

As shown in FIG. 15, the contact holes 92 are filled with the first metal layer 98, such as tungsten (W), and the surface diffusion barrier layer 94 is covered with the first metal layer 98 to electrically connect the gate electrode 66 and the source/drain regions 64. Then, the first patterned hard mask 81 is used as a stop layer to in a first CMP process on the first metal layer 98 and the diffusion barrier 94 in order to form every contact plug 100 in the first dielectric layer 78, as shown in FIG. 16.

Figure 17:
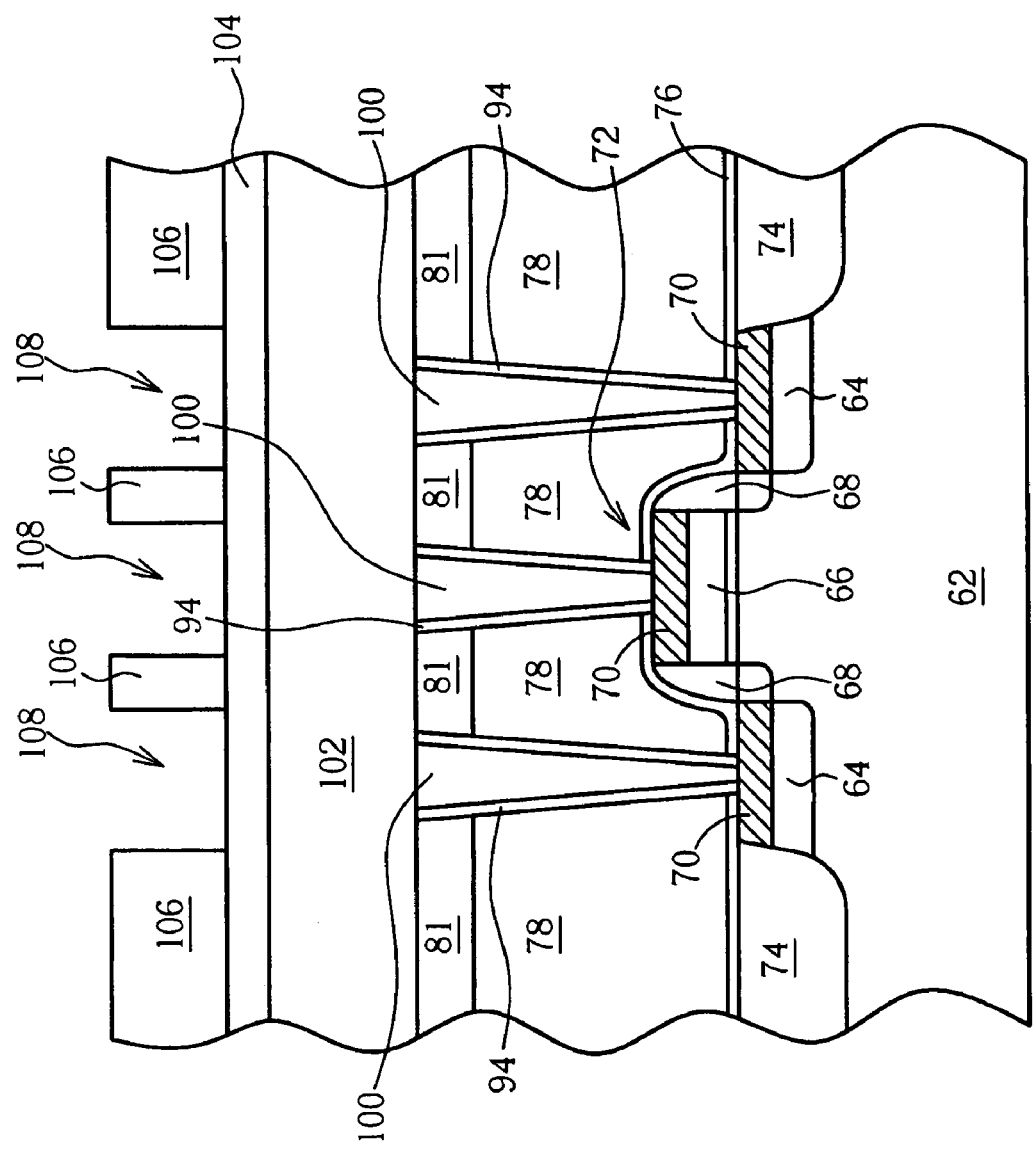
Figure 18:
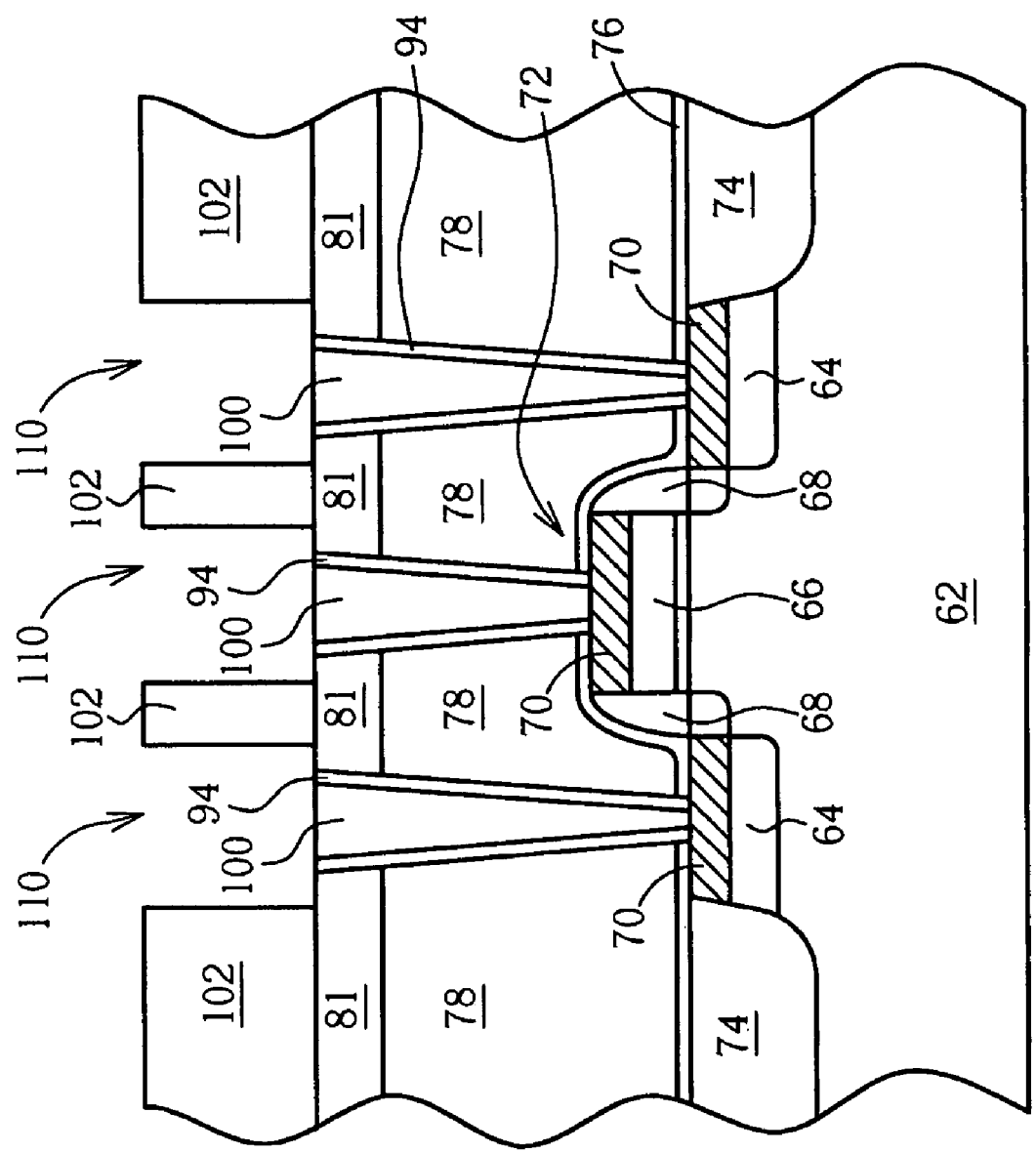

As shown in FIG. 17, a second dielectric layer 102, a second BARC layer 104, and a second patterned hard mask layer 106 are formed upon the first hard mask layer 81 and every contact plug 100 in sequence. The second patterned hard mask layer 106 has a plurality of openings 108. The openings 108 are disposed corresponding to every contact plug 100 electrically connecting the gate electrode 66 and the source/drain regions 64 so as to define the locations of trenches 110. Then, second patterned hard mask layer 106 is used as an etching mask, the first hard mask layer 81 and the surface of contact plugs 100 are used as an etch stop layer to etch the second BARC layer 104 and the second dielectric layer 102 to form trenches 110 in the second BARC layer 104 and the second dielectric layer 102, and the second patterned hard mask layer 106 and the second BARC layer 104 are removed, as shown in FIG. 18. The second dielectric layer 102 may include tetraethylorthosilicate (TEOS) oxide, un-doped silicon glass, or doped silicon oxide, such as borophosphosilicate glass (BPSG), FSG, PSG or BSG. Spin coating or CVD, such as a PECVD method, or other deposition techniques may be used to deposit the second dielectric layer. The second patterned hard mask layer 106 is made of photoresist material.

Figure 19:
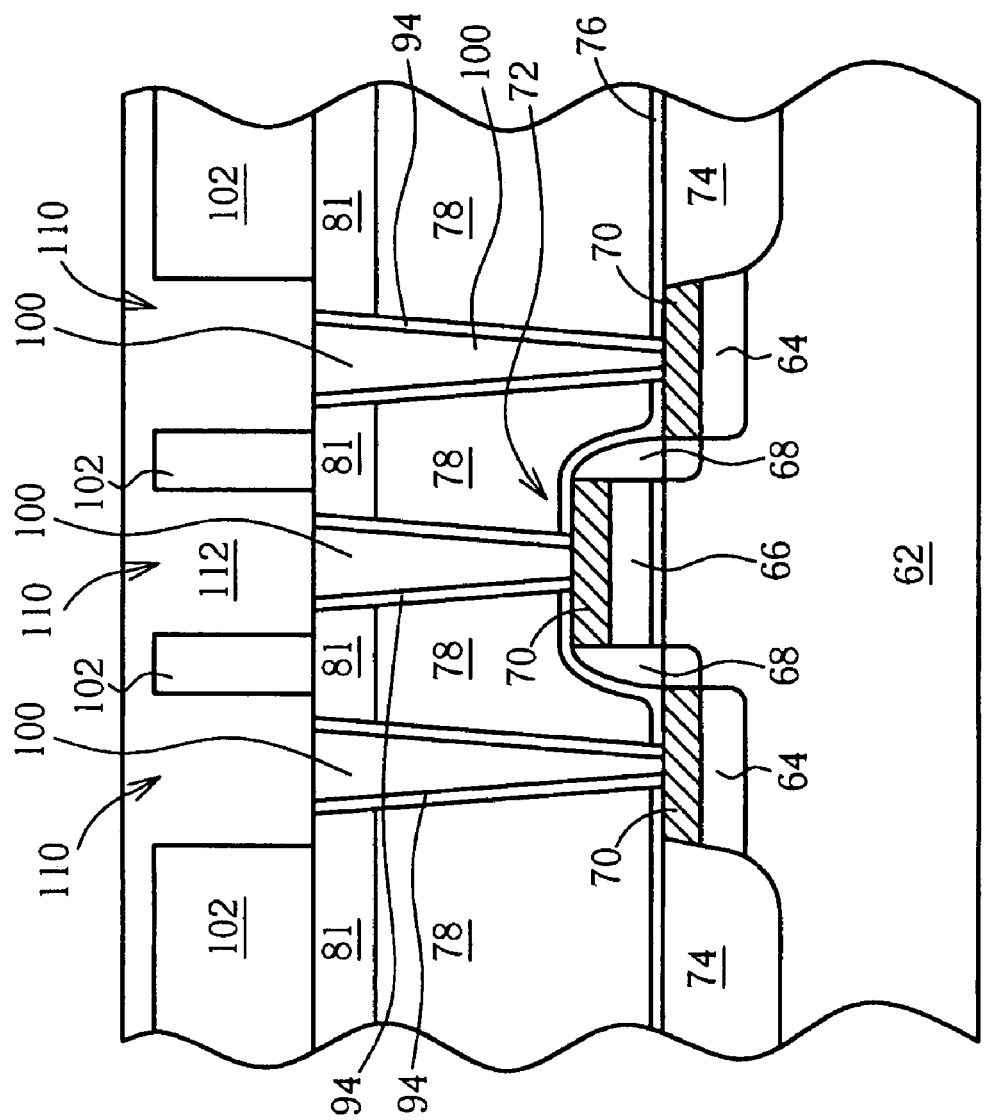
Figure 20:
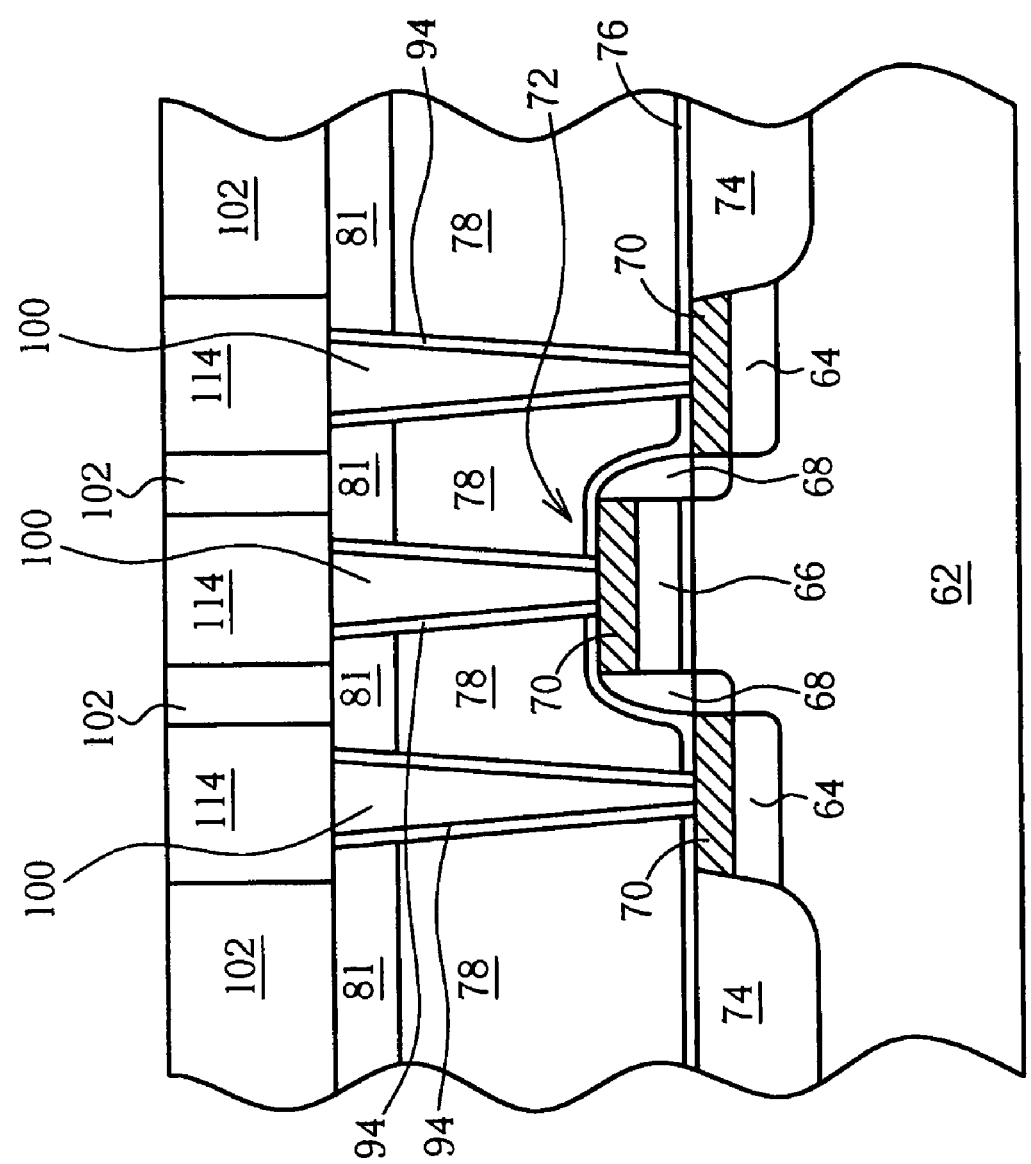

As shown in FIG. 19, a standard copper process or other low-resistance conductor process is carried out to deposit a diffusion barrier layer of TiN/Ti or TaN/Ta (not shown) and a seed layer (not shown) over sidewalls of every trench 110, upon the second dielectric layer 102, and every contact plug 100. Then, electroplating is performed to form a second metal layer 112 to fill the trench 110, as is well known. Finally, the second dielectric layer 102 is used as a stop layer in a second CMP process on the second metal layer 112 and the diffusion barrier (not shown) in order to form every metal wire 114 electrically connected to every contact plug 100 separately, as shown in FIG. 20.

As mentioned above, the present invention also discloses a metal interconnect structure. As shown in FIG. 20, the metal interconnect structure of the present invention is positioned on a semiconductor substrate 62, and at least a first electric conductor, such as a MOS transistor device 72 comprising a gate electrode 66, source/drain regions 64, and a spacer structure 68, is positioned on the semiconductor substrate 62. The metal interconnect structure comprises a first dielectric layer 78 positioned on the substrate and covering the first electric conductor, a first patterned hard mask 81 positioned on the first dielectric layer 78, contact plugs 100 positioned in the first patterned hard mask 81 and the first dielectric layer 78 and electrically connected with the first electric conductor, a second dielectric layer 102 positioned on the first patterned hard mask 81 and the contact plugs 100, and metal wires 114 positioned in the second dielectric layer 102 and over the first patterned hard mask 81 and electrically connected with the contact plugs 100. The materials of each film layer and conductor are disclosed in the embodiment of FIG. 12-20, and are not redundantly described here.

The present invention uses the patterned photoresist layer 84 as an etching mask to etch the hard mask layer 80 and transfer a pattern of the patterned photoresist layer 84 to the hard mask layer 80 first to form the first patterned hard mask 81, and then uses the first patterned hard mask 81 as an etching mask to etch the first dielectric layer 78 to form the contact holes 92. Therefore, a etch program can be used to control a critical dimension of the pattern on the first patterned hard mask 81 to make AEI CD smaller than ADI CD. The first patterned hard mask 81 of the present invention can be an etching mask of contact holes 92, a stop layer of a CMP process for contact plugs 100, and an etch stop layer of the trench 100 in a follow-up metal interconnect process. In addition, since a process under 65 nm needs NiSi as silicide 70 on the gate electrode 66 and the source/drain regions 64, the present invention uses SiC or SiCN made at low temperature as the hard mask layer 80. The forming temperature of the hard mask layer 80 is under 400° C., and therefore phase variation of NiSi positioned upon gate electrode 66 and source/drain regions 64 can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for making a metal interconnect comprising:
providing a substrate and at least a first electric conductor;
forming a first dielectric layer over the first electric conductor on the substrate;
forming a first patterned hard mask on the first dielectric layer to define at least a first opening;
using the first patterned hard mask as an etching mask to etch the first dielectric layer to form the first opening in the first dielectric layer;
forming a first metal layer to fill the first opening and covering the first patterned hard mask;
using the first patterned hard mask as a polishing stop layer and performing a polishing process on the first metal layer to form a second electric conductor in the first opening and electrically connecting the second electric conductor to the first electric conductor;
forming a second dielectric layer over the first patterned hard mask and the second electric conductor;
forming a second patterned hard mask on the second dielectric layer to define at least a second opening;
using the second patterned hard mask as an etching mask and using the first patterned hard mask and the second electric conductor as an etch stop layer to etch the second dielectric layer to form the second opening in the second dielectric layer; and
forming a third electric conductor in the second opening and electrically connecting the third electric conductor to the second electric conductor.

2. The method of claim 1, wherein the first electric conductor comprises a gate, a source, a drain, or a doped region.

3. The method of claim 2, wherein the first opening is a contact hole and the second electric conductor is a contact plug.

4. The method of claim 3, wherein a contact etch stop layer (CESL) is formed between the substrate and the first dielectric layer and covers the first electric conductor.

5. The method of claim 1, wherein forming the first patterned hard mask comprises:
forming a mask layer, a bottom antireflective coating (BARC) layer, and a patterned photoresist layer on the first dielectric layer;
using the patterned photoresist layer as an etching mask to etch the BARC layer and the mask layer to transfer the pattern of the patterned photoresist layer to the mask layer to form the first patterned hard mask; and
removing the patterned photoresist layer and the BARC layer.

6. The method of claim 5, wherein an after-development-inspection critical dimension (ADI CD) of the patterned photoresist layer is larger than an after etch-inspection critical dimension (AEI CD) of the first patterned hard mask.

7. The method of claim 5, wherein the first electric conductor contains a silicide layer, and a forming temperature of the mask layer is under 400° C.

8. The method of claim 7, wherein the mask layer is composed of a chemical compound of silicon with carbon or nitrogen.

9. The method of claim 1, wherein the second opening includes a via hole, a trench, a single damascene opening, or a dual damascene opening.

10. The method of claim 9, wherein the third electric conductor includes a via plug or a metal line.

11. The method of claim 9, wherein forming the third electric conductor in the second opening comprises:

forming a second metal layer to fill the second opening and covering the second electric conductor and part of the first patterned hard mask; and using the second dielectric layer as stop layer and performing a second CMP process for the second metal layer.

12. The method of claim 11, wherein the second metal layer includes copper.

13. The method of claim 1, wherein the second patterned hard mask layer is a patterned photoresist layer.

14. The method of claim 1, wherein a BARC layer is formed between the second patterned hard mask layer and the second dielectric layer.

* * * * *